(12) United States Patent
Houston et al.

(10) Patent No.: US 7,341,808 B2
(45) Date of Patent: Mar. 11, 2008

(54) METHOD AND SYSTEM FOR CONTIGUOUS PROXIMITY CORRECTION FOR SEMICONDUCTOR MASKS

(75) Inventors: Theodore W. Houston, Richardson, TX (US); Robert Alan Soper, Plano, TX (US); Guohong Zhang, Plano, TX (US); Kayvan Sadra, Addison, TX (US)

(73) Assignee: Texas Instruments Incorporated, Dallas, TX (US)

( * ) Notice: Subject to any disclaimer, the term of this patent is extended or adjusted under 35 U.S.C. 154(b) by 552 days.

(21) Appl. No.: 10/895,512

(22) Filed: Jul. 20, 2004

(65) Prior Publication Data

US 2006/0019202 A1    Jan. 26, 2006

(51) Int. Cl.
*G03F 7/00* (2006.01)
*G03F 9/00* (2006.01)

(52) U.S. Cl. .......................................... 430/5; 430/313

(58) Field of Classification Search .............. 430/5, 430/313
See application file for complete search history.

(56) References Cited

U.S. PATENT DOCUMENTS 6,465,138 B1*  10/2002  Stanton ........................ 430/5
6,692,900 B2*  2/2004  Baggenstoss ............... 430/313

OTHER PUBLICATIONS

U.S. Appl. No. 10/406,101, filed Apr. 2, 2003, entitled "Photo Reticles using Channel Assist Features", 15 pages of text and 2 pages of drawings.

* cited by examiner

*Primary Examiner*—Mark F. Huff
*Assistant Examiner*—Caleen O. Sullivan
(74) *Attorney, Agent, or Firm*—W. James Brady, III; Frederick J. Telecky, Jr.

(57) ABSTRACT

According to one embodiment, a method for patterning a set of features for a semiconductor device includes providing a mask including a substrate and at least one pair of first and second main features disposed on a substrate. The method also includes positioning the mask over a layer of light-sensitive material, and exposing the mask to a light source. The mask also includes at least one sub-resolution feature connecting the first and second main features.

20 Claims, 6 Drawing Sheets

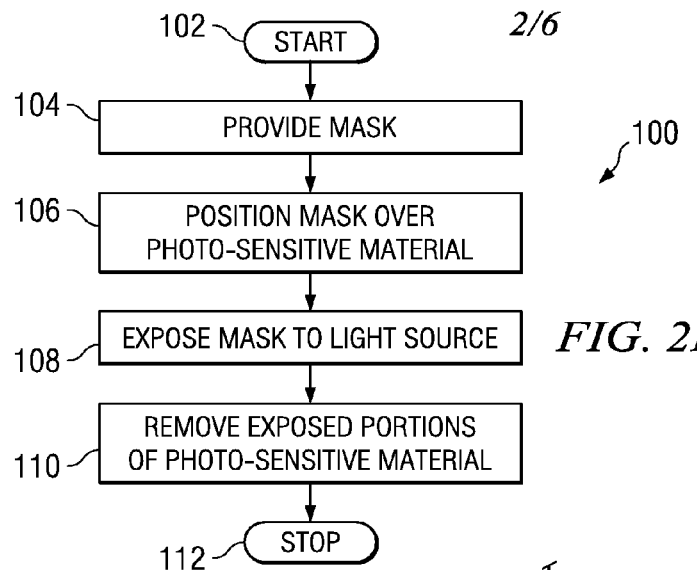
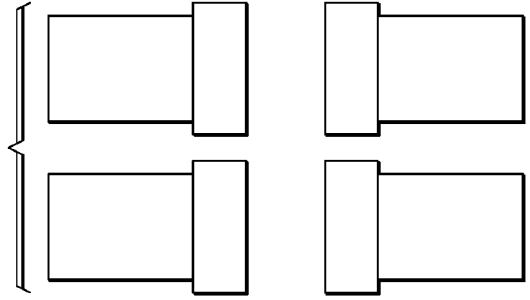
FIG. 2B
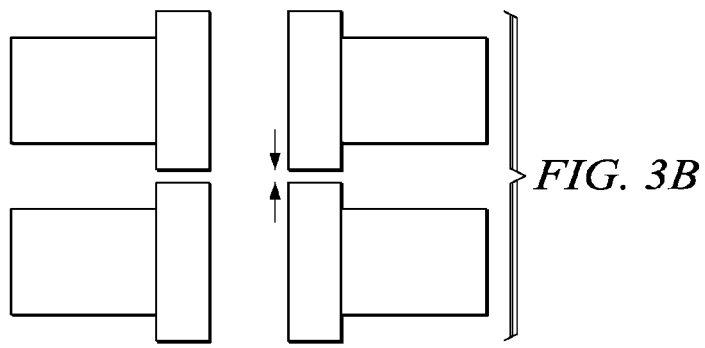
FIG. 3A
FIG. 3B
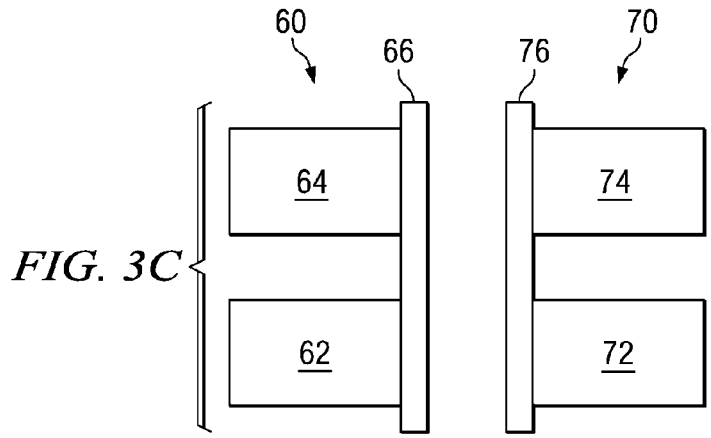
FIG. 3C

FIG. 6
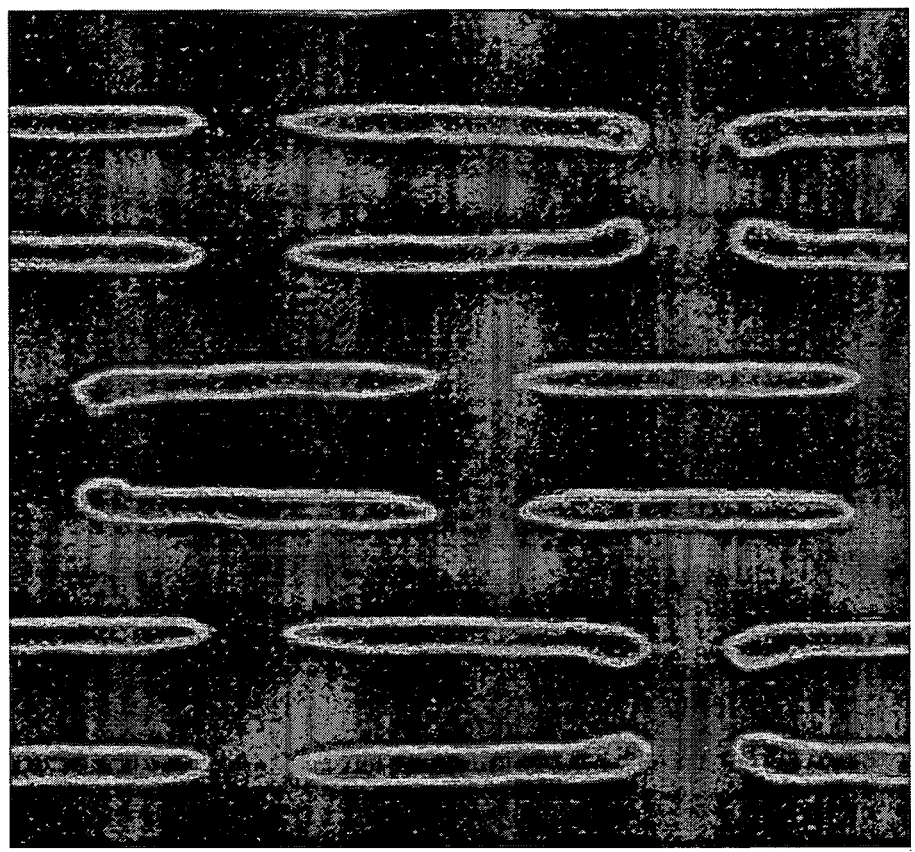
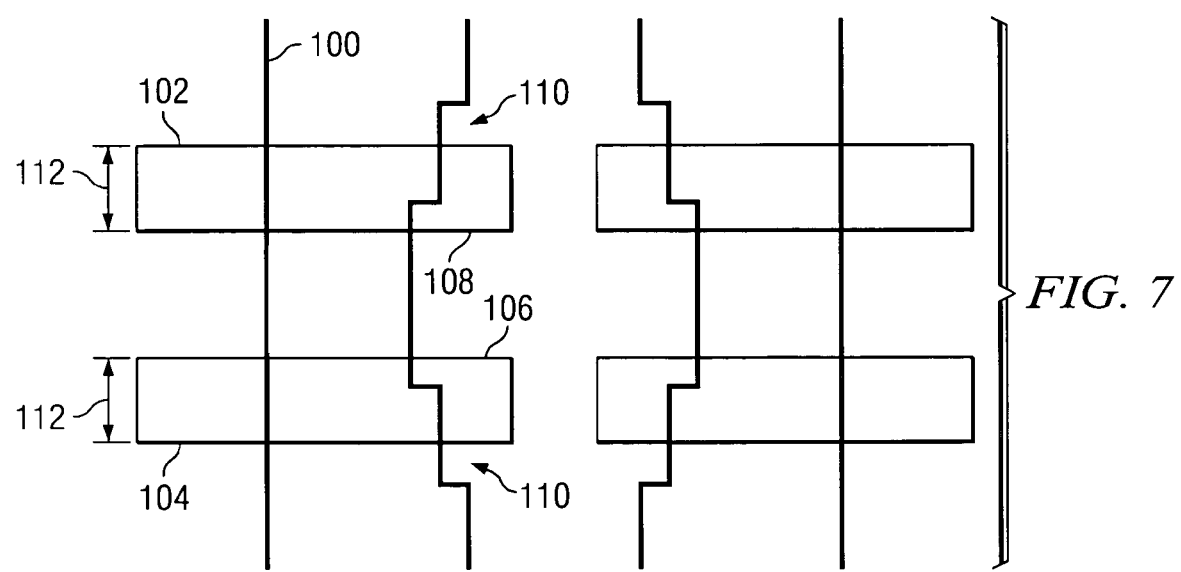
FIG. 7

METHOD AND SYSTEM FOR CONTIGUOUS PROXIMITY CORRECTION FOR SEMICONDUCTOR MASKS

TECHNICAL FIELD OF THE INVENTION

This invention relates generally to semiconductor fabrication, and more particularly to a method and system for contiguous proximity correction in semiconductor masks.

BACKGROUND OF THE INVENTION

Semiconductor device fabrication frequently involves patterning features through the use of a mask and photo-sensitive material. Due to constraints in the lithographic process, the pattern formed in the photo-sensitive material does not coincide exactly with the mask pattern. In particular, for rectangular patterns, corners round and ends pull back. Thus conventional masks often compensate for this phenomenon, and the mask is formed with features that differ somewhat from the feature desired to be patterned in the photo-sensitive material. One approach utilizes additional sub-resolution features. The sub-resolution features are placed in a location that affects the manner in which the main features are patterned in the lithography process. These types of features are called optical proximity correction features, and are often utilized to pull two main features closer together when patterned. Often these main features are used to form the gate of a transistor.

However, as transistor sizes shrink, limits on inspection capabilities limit how close two main features may be formed to each other. Conventionally, every mask must be inspected, and the use of optical proximity correction features between two main features cannot always be utilized because the inspection capabilities cannot inspect closely-spaced features.

SUMMARY OF THE INVENTION

According to one embodiment, a method for patterning a set of features for a semiconductor device includes providing a mask including a substrate and at least one pair of first and second main features disposed on a substrate. The method also includes positioning the mask over a layer of light-sensitive material, and exposing the mask to a light source. The mask also includes at least one sub-resolution feature connecting the first and second main features.

Some embodiments of the invention provide numerous technical advantages. Some embodiments may benefit from some, none, or all of these advantages. For example, according to one embodiment, a method and system for contiguous proximity correction for semiconductor masks is provided that results in greater flexibility and optimization of proximity correction performance without mask inspection problems. This approach may be applied to both in-line and staggered line features. Further the approach of the current invention in some embodiments is robust with respect to the width of the proximity correction feature, the focus of the lithography process, and misalignment with respect to an active region of a transistor.

Other technical advantages may be readily ascertainable by one of skill in the art.

BRIEF DESCRIPTION OF THE FIGURES

For a more complete understanding of the invention, and for further features and advantages, reference is now made to the following description, taken in conjunction with the accompanying drawings, in which:

FIG. 2B is a flow chart illustrating a method for patterning features according to the teachings of the invention;

FIGS. 3A-3C are a series of schematic diagrams illustrating various masks that may be used for optical proximity correction of features according to a topology from that of FIGS. 1A-1C;

FIG. 6 is an enlarged photograph showing resulting polysilicon features after etch from a process according to the teachings of the invention;

FIG. 7 is a schematic diagram showing the relationship between a polysilicon gate region formed according to the teachings of the invention with respect to a corresponding active region of a transistor.

DETAILED DESCRIPTION OF THE INVENTION

Embodiments of the invention and its advantages are best understood by referring to FIG. 1A-8 of the drawings, like numerals being used for like and corresponding parts of the various drawings.

Figure 1A:
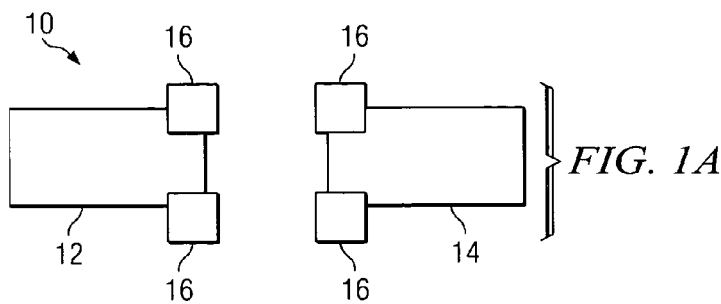
FIGS. 1A-1C are a series of schematic diagrams illustrating masks that may be used for optical proximity correction.
Figure 1B:
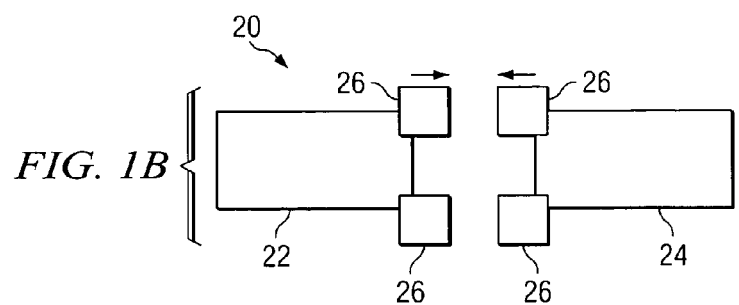
Figure 1C:
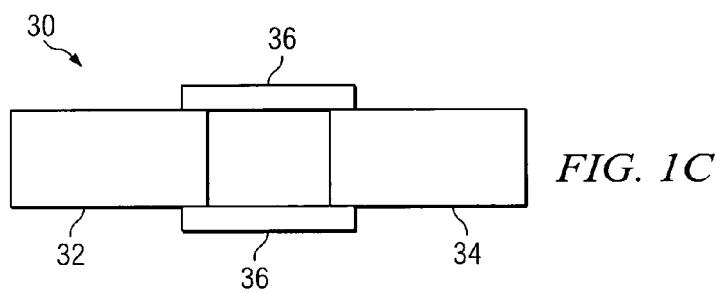

FIGS. 1A-1C are a series of schematic diagrams showing a series of masks. Mask 10 is used to pattern a feature in photosensitive material (such as photoresist) for later formation of a portion of a semiconductor device. In FIG. 1A mask 10 includes a pair of main features 12 and 14 and optical proximity correction features 16 disposed on the corners of main features 12 and 14. Optical proximity correction features 16 are sub-resolution, meaning that they will not print on the photo-sensitive material in the lithography process utilized with mask pattern 10. Features 12, 14 and 16 may be formed on a substrate, such as glass or other suitable substrate. Conventional materials for features 12, 14, and 16 include chrome formed on a glass substrate; however any type of suitable mask materials may be utilized. This mask 10 illustrates an ineffective correction by optical proximity correction features 16 because main features 12 and 14 are not pulled close enough to each other as desired for proper operation of a resulting transistor (or other semiconductor device).

In contrast, FIG. 1B illustrates a mask 20, which includes main features 22 and 24 and optical proximity correction features 26. In this example, correction is effective because optical proximity correction features 26 are closely spaced such that main features 22 and 24 are pulled close enough to each other through the lithography process. As described above, optical proximity correction features 26, when patterned, result in a pattern feature in the photo-sensitive material in the lithography process that effectively pulls main features 22 and 24 together. This is due to the extra regions through which light cannot pass. However, when patterned alone, sub-resolution optical proximity correction features 26 will result in no pattern on the underlying photo-sensitive material. A problem with the approach of FIG. 1B, however, is that the small distance on the mask between optical proximity correction features 26 cannot be inspected. This is due to the limitations in the inspectability process. Because optical proximity correction features 26 cannot be inspected, this alternative approach cannot be effectively utilized.

According to the teachings of the invention, instead of using optical proximity correction features such as those illustrated in FIGS. 1A and 1B, contiguous optical proximity correction features are utilized. In FIG. 1C a mask 30 includes first and second main features 32 and 34 and contiguous optical proximity correction features 36. Contiguous optical proximity correction features 36 are sub-resolution, and will not be patterned absent their connection to main features 32 and 34. The use of contiguous proximity correction features avoids the inspection problem associated with the optical proximity correction features 26 of FIG. 1B, yet results in feature 32 and 34 patterning desired patterns in the underlying photo-sensitive material. Contiguous optical proximity correction features 36 appear "skinny" to avoid these features from being printed. Since they are longer than optical proximity correction features 26, they are made less thick to avoid printing. The actual size of contiguous optical proximity correction features 36 can be determined through simulation based upon the particular underlying lithography process.

According to one embodiment, contiguous optical proximity correction features 36 connect main features 32 and 34 at their respective corners. This allows the pulling together of the corresponding features 32 and 34 while at the same time maintaining the general depth of these features, reducing corner rounding and reducing the narrowing of the line end. This contrasts with general assist features, which are described in copending application having a title of Photo Reticles using Channel Assist Features, a Ser. No. 10/406,101, and filing date of Apr. 2, 2003, which is hereby incorporated by reference, in which contiguous features are used to couple together main features on a mask so that they do not appear isolated and can therefore print better. In those applications, the sub-resolution feature connects the main features but, because the purpose is different, does not connect the main features at the corners of the main features. In those applications the intent may be to obtain the desired area of the pattern without concern for maintaining a rectangular shape. Features resulting from these teachings of the invention are described with reference to FIGS. 2A and 2B.

Figure 2A:
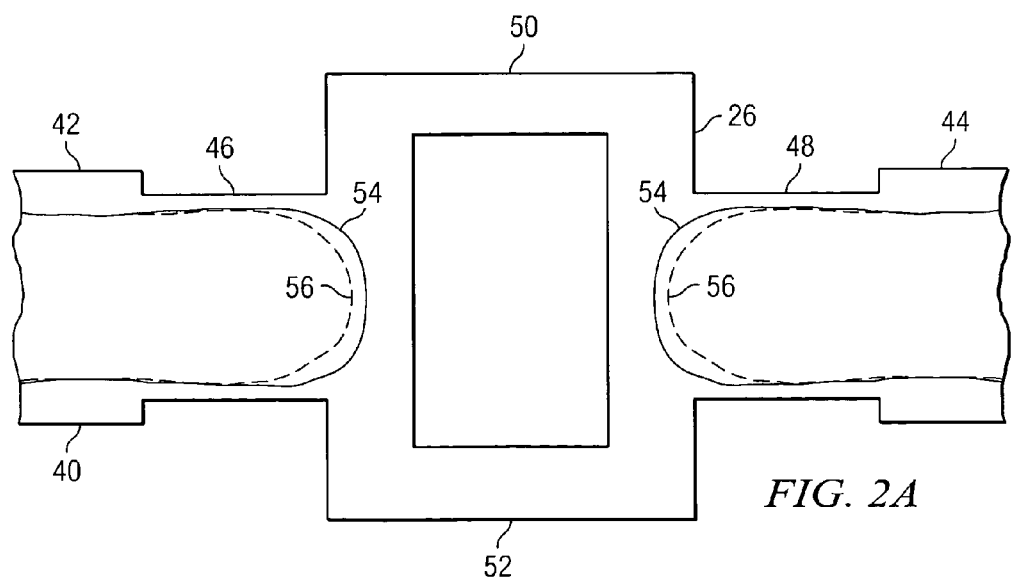
FIG. 2A is a schematic diagram illustrating an example mask according to the teachings of the invention as well as patterns resulting from the mask.

FIG. 2A is a schematic drawing showing on the same figure a mask according to the teachings of the invention, the pattern resulting from the mask, and a comparison to a pattern that would result absent the contiguous optical proximity correction features. Mask 40 includes main features 42 and 44, having notches 46 and 48 as well as contiguous optical proximity correction features 50 and 52. Lines 54 indicate the pattern formed through using mask 40 and line 56 indicates the pattern that would be formed by using mask 40 without contiguous optical proximity correction features 50. As illustrated, the resulting pattern 54 results in a shorter distance between the two main features of the pattern and less loss of the corners of the pattern than would occur absent the use of the contiguous optical proximity correction features 50 and 52. Notches 46 and 48 illustrate that the resulting pattern mask that is utilized in conjunction with the contiguous optical proximity correction features may take into account the effect of the contiguous optical proximity correction features. In this example, notches 46 and 48 are included to address refraction that would otherwise occur.

FIG. 2B is a flow chart illustrating a method for patterning features according to the teachings of the invention. Method 100 begins at step 102. At step 104 a mask is provided. The mask may take the form of the mask illustrated in FIG. 1C, FIG. 3C, FIG. 8C, FIG. 8D, or other suitable form that utilizes contiguous optical proximity correction features. At step 106 the provided mask is positioned over a photo sensitive material, such as photoresist. At step 108, the mask is exposed to a light source, such as light sources conventionally used in photography processes used in semiconductor device fabrication. At step 110 portions of the photo sensitive material exposed to the light at step 108 are removed, leaving a region in which a semiconductor device feature may be formed. (For some types of light sensitive material, the unexposed material is removed.) The photo-sensitive material may be removed through any suitable removal process, such as an isotropic etch, for example. In one example the feature formed may be a set of gates; however, other suitable features may be formed. The method concludes at step 112. Thus, according to the teachings of the inventions, a process utilizing masks having contiguous optical proximity correction features may be utilized, resulting in desirable feature patterning.

FIGS. 3A-3C illustrate examples analogous to the examples provided above in conjunction with FIGS. 1A-1C, except that these masks apply to pairs of main features. Similar to FIGS. 1A and 1B, FIGS. 3A and 3B each illustrate first and second pairs of main features for which correction is either ineffective (FIG. 3A) for the same reasons as those described above in conjunction with FIG. 1A or correction is not practical (FIG. 3B) because of the lack of inspectability described above in conjunction with FIG. 1B. The teachings of the invention apply to the mask of FIG. 3C in which a first pair 60, and a second pair 70 of main features are utilized. First pair 60 includes a first main feature 62 and a second main feature 64, and second pair 70 includes a first main feature 72 and a second main feature 74. Also shown in FIG. 3C are contiguous optical proximity correction features 66 and 76. As illustrated, in this example, contiguous optical proximity correction features 66 and 76 connect main features that lie on top of one another, as opposed to being separated from each other in a longitudinal direction. Thus in this example, features 66 and 76 operate to pull pair 60 and 70 toward each other when patterned resulting in a pattern in the photo-sensitive material with a small gap between corresponding main features. As with sub-resolution contiguous optical proximity correction features 36, the width of features 66 and 76 is selected small enough such that the size of these features falls below the resolution of the corresponding lithography process.

Figure 4A:
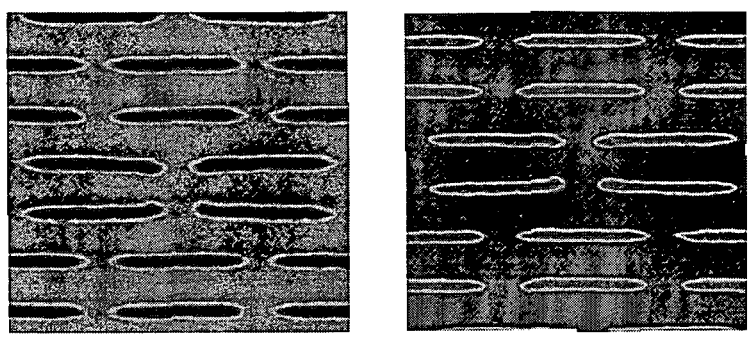
FIGS. 4A-4D are a series of photographs illustrating test data for one embodiment of the present invention showing robustness of the invention with respect to feature width.
Figure 4B:
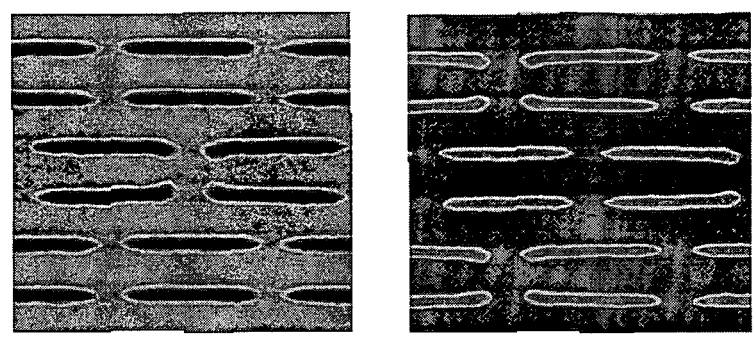
Figure 4C:
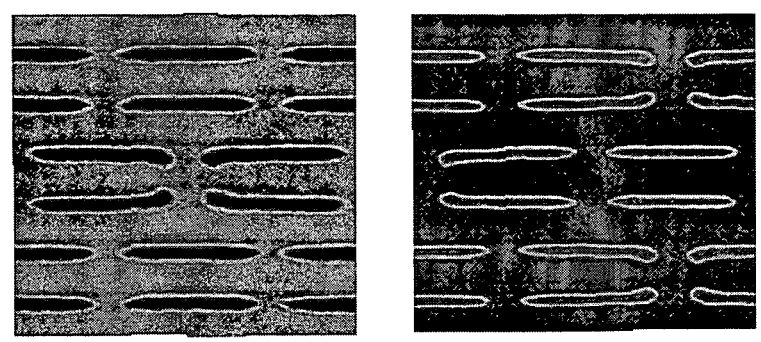
Figure 4D:
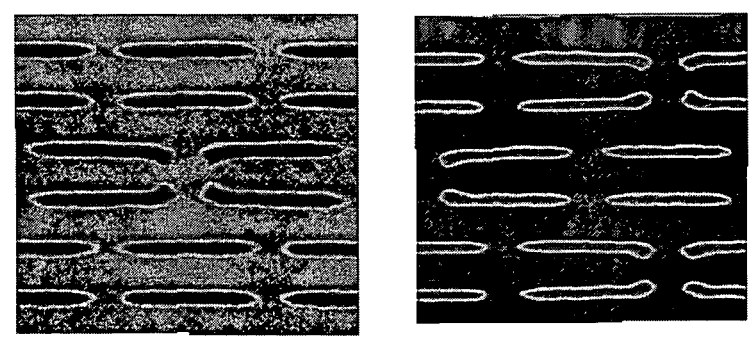

Data associated with the patterning of FIG. 3C is illustrated in FIGS. 4A-4D. FIGS. 4A-4D are photographs of actual data showing the polysilicon pattern (top row) resulting from such a mask and the resulting polysilicon feature post-etch (bottom row) for a variety of widths of features 66 and 76. FIG. 4A is associated with a width of features 66 and 76 of 30 nanometers; FIG. 4B is associated with a width of 35 nanometers; FIG. 4C is associated with a width of features 66 and 76 at 40 nanometers; and FIG. 4D is associated with a width of features 66 and 76 of 45 nanometers. As illustrated, over these width ranges the sub-resolution features 66, 76 operate to pull the resulting main features toward each other. These photographs collectively demonstrate that, in some embodiments, the teachings of the invention may be applied over a range of widths for the sub-resolution features and is robust with respect to the width of the feature. Therefore, the actual width of the correction features does not require tight control, because the approach works well for a wide range of widths.

Figure 5A:
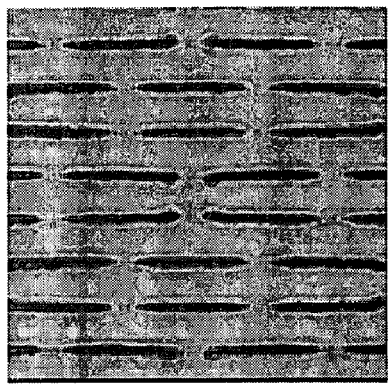
FIGS. 5A-5E are a series of photographs illustrating data for the present invention showing robustness with respect to focus of the lithography process.
Figure 5B:
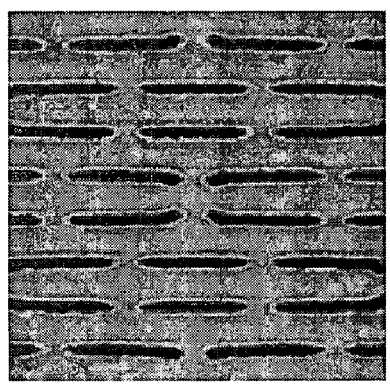
Figure 5C:
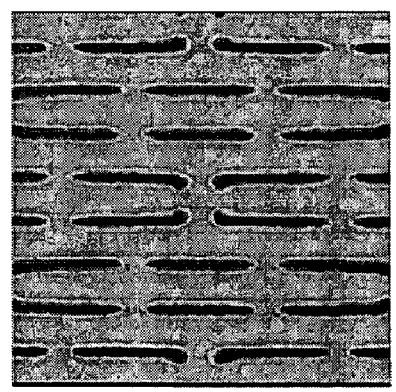
Figure 5D:
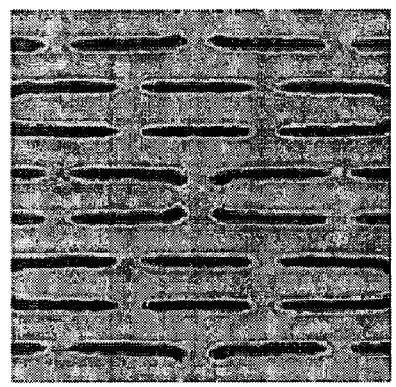
Figure 5E:
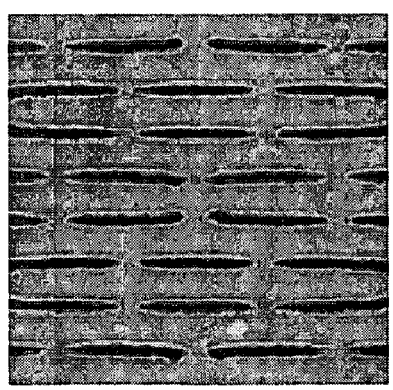

FIGS. 5A-5E illustrate the polysilicon pattern resulting from the mask of FIG. 3C for a range of focuses. FIG. 5A corresponds to a focus of −0.2 micrometers; FIG. 5B corresponds to a focus of −0.1 micrometers; FIG. 5C corresponds to a focus of 0.0 micrometers; FIG. 5D corresponds a focus of 0.1 micrometers; and FIG. 5E corresponds to a focus of 0.2 micrometers. Collectively FIGS. 5A-5E demonstrate that, in some embodiments, the approach of the current invention is robust with respect to focus. Thus, even when the lithography process is somewhat out of focus, the desired result may obtain. This contrasts with the traditional correction approach in which, as the lithography process moves out of focus, a short is often created between adjacent main features. In contrast, according to the teachings of the present invention, when focus becomes too bad, the proximity correction features cannot be seen and thus no short is created.

FIG. 6 is enlarged photograph illustrating the post-etched pattern in polysilicon that forms from the pattern of the mask of FIG. 3C. A desirable outcome illustrated in this figure is that, at some point, the main features have widths that are relatively constant. Although the ends of each of these features are somewhat pointed, the important aspect is that there is a point at which the width is fairly constant. The distance between the two locations at which the main features have a relatively constant width is the distance that is desired to be minimized.

FIG. 7 is a schematic diagram showing a representation of ideal gates 102, 104 overlying an active region 100. In general, this figure demonstrates the robustness of the current invention, in some embodiments, with respect to misalignment. A corresponding mirror image of gates 102, 104 and active region 100 is shown on the right side of FIG. 7. Although the invention is described in the context of forming a gate region, this context is used for example purposes only, and other regions may pattern according to the teachings of the invention. As shown in FIGS. 4-6, edges 106 and 108 tend to bend toward each other, (bend not illustrated in FIG. 7) but active region 100 underlying these gate regions typically has jogs 110 corresponding somewhat to the bend that would occur at edges 106 and 108. Thus, even though the resulting features tend to bend toward each other at their ends 106, 108, there is a region 112 at which the width of the gate regions 102, 104 overlying the active region 100 is relatively constant. Further, the bending can also be addressed by using standard proximity correction features such as serifs and anti-serifs, if desired.

Figure 8A:
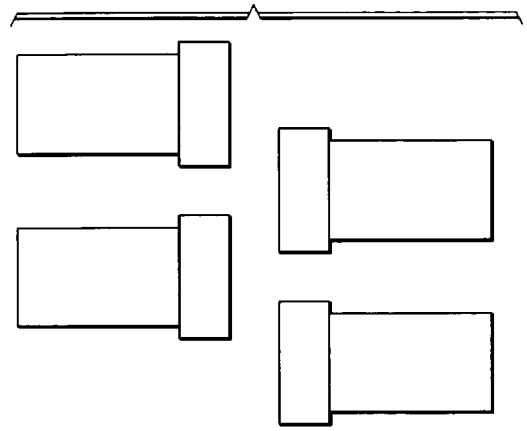
FIGS. 8A-8D are a series of schematic diagrams illustrating the applicability of the teachings of the invention to a series of staggered features, in addition to in-line features.
Figure 8B:
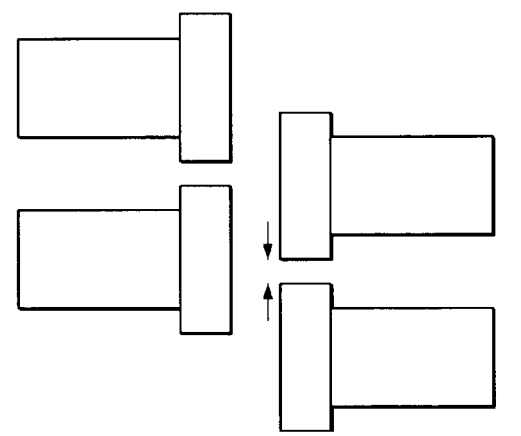
Figure 8C:
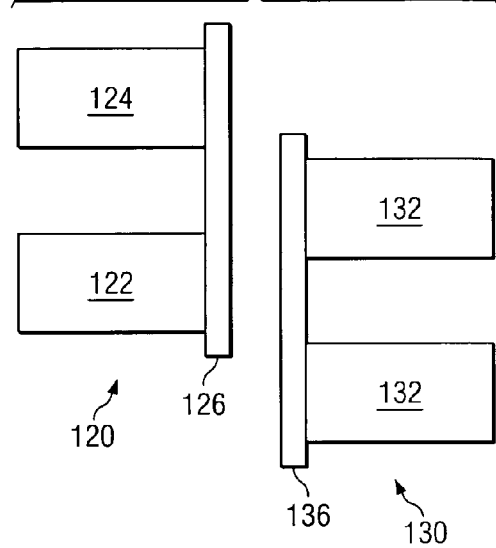

FIGS. 8A-8D illustrate additional embodiments in which the teachings of the invention may be applied. The embodiments at FIGS. 1 and 3 involve two different examples in which the main features that were pulled toward each other through the sub-resolution correction features were generally aligned along their longitudinal axes. In contrast FIGS. 8A-8D involve staggered main features. FIGS. 8A and 8B are analogous to the features illustrated in FIGS. 3A and 3B except that they are staggered. In FIG. 8C two pairs of features 120 and 130 correspond to those described above with respect to FIG. 30 except that main features 122 and 124 of first set 120 are not aligned with main features 132 and 134 of second set 130. Proximity correction features 126 and 138 operate in a similar fashion to those described above in conjunction with FIG. 3C.

Figure 8D:
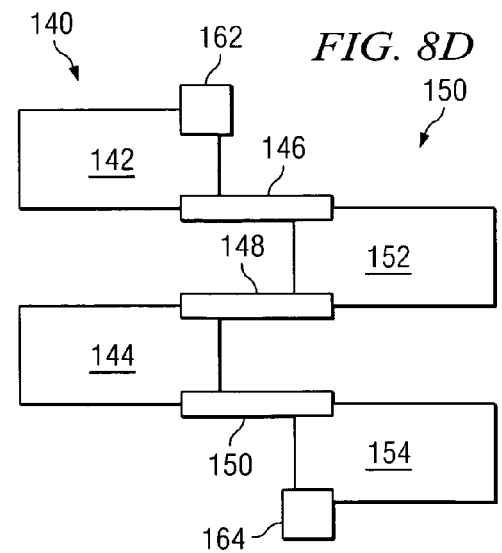

In FIG. 8D a somewhat different approach is applied. First set 140 and second set 150, which are similar to sets 120 and 130, respectively, can also be pulled toward each other through the use of optical proximity correction features 146, 148 and 150, as well as traditional proximity correction features 162 and 164. As illustrated, contiguous optical proximity correction features 146, 148 and 150 are utilized in the manner analogous to those described above in conjunction with FIG. 1C. In addition, conventional optical proximity correction features 162 and 164 are placed at the corners of main features 142 and 154, respectively, to further assist correction of this portion of those features.

Although the present invention has been described in detail, it should be understood that the various changes, substitutions, and alterations can be made hereto without departing from the spirit and scope of the invention as defined by the appended claim. For example, while the above-described sub-resolution features have been illustrated by example as rectangles, they may take any other shape. In particular, for joining main features with larger offset from co-linear, the sub-resolution feature may have both vertical and horizontal components.

What is claimed is:

1. A method for patterning a set of features for a semiconductor device, comprising:
   providing a mask including a substrate and at least one pair of first and second main features disposed on the substrate;
   positioning the mask over a layer of light-sensitive material; and
   exposing the mask to a light source;
   wherein the mask further comprises at least one sub-resolution feature connecting the first and second main features,
   wherein the first and second main features include longitudinal axes that are generally parallel to each other but are not co-linear and feature edges that are co-linear, and further wherein the at least one sub-resolution feature is positioned along the entire length of the co-linear edges.

2. The method of claim 1 wherein the at least one sub-resolution feature comprises first and second sub-resolution features.

3. The method of claim 2, wherein the first and second main features are generally rectangular, each having a first side, a second side, and opposite end sides, the first and second sides being longer than the end sides.

4. The method of claim 3, wherein the first and second sub-resolution features are generally rectangular.

5. The method of claim 2, and further comprising forming a pair of gates in a region of the semiconductor device corresponding to the first and second main features.

6. A method for patterning a set of features for a semiconductor device comprising:
   providing a mask including a substrate and first and second pairs of first and second main features disposed on the substrate;
   positioning the mask over a layer of light-sensitive materials; and
   exposing the mask to a light source;
   wherein the mask further comprises first and second sub-resolution features connecting the first and second pairs of first and second main features, and
   wherein, for each of the first and second pairs, the first and second main features have longitudinal axes that are generally parallel to each other but are not co-linear, and the main features of the first pair are not aligned with the main features of the second pair.

7. The method of claim 6, wherein the first and second main features are generally rectangular each having a first side, a second side, and opposite end sides, the first and second sides being longer than the end sides.

8. The method of claim 7, wherein the first and second sub-resolution features are generally rectangular.

9. The method of claim 6, wherein the first sub-resolution feature connects the first main features of each pair along an end side of each first main feature and wherein the second sub-resolution feature connects the second main feature of each pair along an end side of each second main feature.

10. A method of claim 6, wherein first sub-resolution feature connects a first corner of the first main feature in the first pair to a first corner of the first main feature in the second pair, and wherein the second sub-resolution feature connects a first corner of the second main feature in the first pair to a first corner of the second main feature in the second pair.

11. The method of claim 6, and further comprising forming four gates in a region of the semiconductor device corresponding to the first and second pairs of first and second main features.

12. A mask for patterning a set of features for a semiconductor device comprising:
a substrate and at least one pair of first and second main features disposed on the substrate; and
at least one sub-resolution feature connecting the first and second main features,
wherein the first and second main features include longitudinal axes that are generally parallel to each other but are not co-linear and feature edges that are co-linear, and further wherein the at least one sub-resolution feature is positioned along the entire length of the co-linear edges.

13. The mask of claim 12, wherein the at least one sub-resolution feature comprises first and second sub-resolution features.

14. The mask of claim 13, wherein the first and second main features are generally rectangular, each having a first side, a second side, and opposite end sides, the first and second sides being longer than the end sides.

15. The mask of claim 14, wherein the first and second sub-resolution features are generally rectangular.

16. A mask for patterning a set of features for a semiconductor device comprising:
a substrate including first and second pairs of first and second main features disposed on the substrate; and
first and second sub-resolution features connecting the first and second pairs of first and second main features,
wherein, for each of the first and second pairs, the first and second main features have longitudinal axes that are generally parallel to each other but are not co-linear, and the main features of the first pair are not aligned with the main features of the second pair.

17. The mask of claim 16, wherein the first and second main features are generally rectangular each having a first side, a second side, and opposite end sides, the first and second sides being longer than the end sides.

18. The mask of claim 17, wherein the first and second sub-resolution features are generally rectangular.

19. The mask of claim 16, wherein the first sub-resolution feature connects the first main features of each pair along an end side of each first main feature and wherein the second sub-resolution feature connects the second end feature of each pair along an end side of each second main resolution feature.

20. A mask of claim 16, wherein first sub-resolution feature connects a first corner of the first main feature in the first pair to a first corner of the first main feature in the second pair, and wherein the second sub-resolution feature connects a first corner of the second main feature in the first pair to a first corner in the second main feature in the second pair.

* * * * *